United States Patent
Ku

(10) Patent No.: US 8,105,922 B2
(45) Date of Patent: Jan. 31, 2012

(54) METHOD OF THIN FILM EPITAXIAL GROWTH USING ATOMIC LAYER DEPOSITION

(75) Inventor: Ching-Shun Ku, Kaohsiung (TW)

(73) Assignee: National Synchrotron Radiation Research Center, Hsin-chu (TW)

( * ) Notice: Subject to any disclaimer, the term of this patent is extended or adjusted under 35 U.S.C. 154(b) by 95 days.

(21) Appl. No.: 12/689,665

(22) Filed: Jan. 19, 2010

(65) Prior Publication Data

US 2011/0177677 A1  Jul. 21, 2011

(51) Int. Cl.
*H01L 21/20* (2006.01)
(52) U.S. Cl. .................. 438/503; 257/E21.461
(58) Field of Classification Search ............ 438/503; 257/E21.461
See application file for complete search history.

(56) References Cited

U.S. PATENT DOCUMENTS

| 2004/0203254 A1* | 10/2004 | Conley et al. .......... 438/778 |
| 2006/0032445 A1* | 2/2006 | Shinriki et al. ......... 118/715 |
| 2006/0125882 A1* | 6/2006 | Hess et al. ............. 347/61 |

* cited by examiner

*Primary Examiner* — Lex Malsawma
(74) *Attorney, Agent, or Firm* — Muncy, Geissler, Olds & Lowe, PLLC

(57) ABSTRACT

A method of thin film epitaxial growth using atomic layer deposition is provided by introducing a first deposition precursor and a second deposition precursor into a chamber after a vent valve connected between the chamber and a vacuum pump is closed. The chamber is maintained in a thermal equilibrium state and a constant pressure as a result of keeping the first deposition precursor and the second deposition precursor inside the chamber thereby reducing deposition precursors consumption and achieving thin film epitaxial growth on the substrate.

11 Claims, 5 Drawing Sheets

US 8,105,922 B2

METHOD OF THIN FILM EPITAXIAL GROWTH USING ATOMIC LAYER DEPOSITION

BACKGROUND OF THE INVENTION

1. Field of the Invention

The present invention relates to a method of thin film growth and more particularly to a method of thin film epitaxial growth using atomic layer deposition.

2. Description of the Prior Art

Atomic layer deposition (ALD) is a technique that allows growth of thin films. For a conventional ALD application, each deposition precursor is alternately pulsed into a carrier gas stream which continuously flows into an ALD chamber and an inert purge gas is introduced into the ALD chamber between each deposition precursor pulse to evacuate the ALD chamber. The conventional ALD process is not suitable for epitaxial growth and for thin films having preferred orientation because the partial pressure of the deposition precursor in the chamber is not stable and a substrate within the chamber is not in thermal equilibrium while reacting with the deposition precursor.

Furthermore, pulsing molecular precursors to uniformly fill high aspect ratio features on the substrate in a short time is difficult because there is no sufficient time for deposition precursors to diffuse to the deep surface on the substrate effectively. Although a conventional ALD method is proposed to resolve the aforementioned issues by extending the time for introducing deposition precursors into the chamber, the resulting deposition precursor consumption is high because most of deposition precursors have not reacted with the substrate before being removed by a vacuum pumping system.

SUMMARY OF THE INVENTION

The present invention is directed to providing a method of thin film epitaxial growth using atomic layer deposition. The method introduces deposition precursors into a chamber after a stock valve connected between the chamber and a vacuum pump is closed, thereby reducing the consumption of deposition precursor and realizing a thin film epitaxial growth on the substrate.

To achieve these advantages and the purpose of the invention, an embodiment of the method of thin film epitaxial growth using atomic layer deposition comprises positioning a substrate within a chamber; pumping the chamber to maintain a base pressure within the chamber via a vacuum pump while a stock valve connected between the chamber and the vacuum pump is open; closing the stock valve followed by flowing a first deposition precursor to the substrate within the chamber, and after stopping flowing the first deposition precursor, the chamber is held in a closure condition for a first period of time to reach thermal equilibrium while forming a first monolayer on the substrate; opening the stock valve to pump the chamber while purging the chamber with a inert gas simultaneously, stopping purging the chamber while continuously pumping the chamber for maintaining the base pressure within the chamber; closing the stock valve followed by flowing a second deposition precursor to the substrate within the chamber, and after stopping flowing the second deposition precursor the chamber is held in a closure condition for a second period of time to reach thermal equilibrium while forming a second monolayer on the substrate; and opening the stock valve to pump the chamber while purging the chamber with the inert gas simultaneously.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
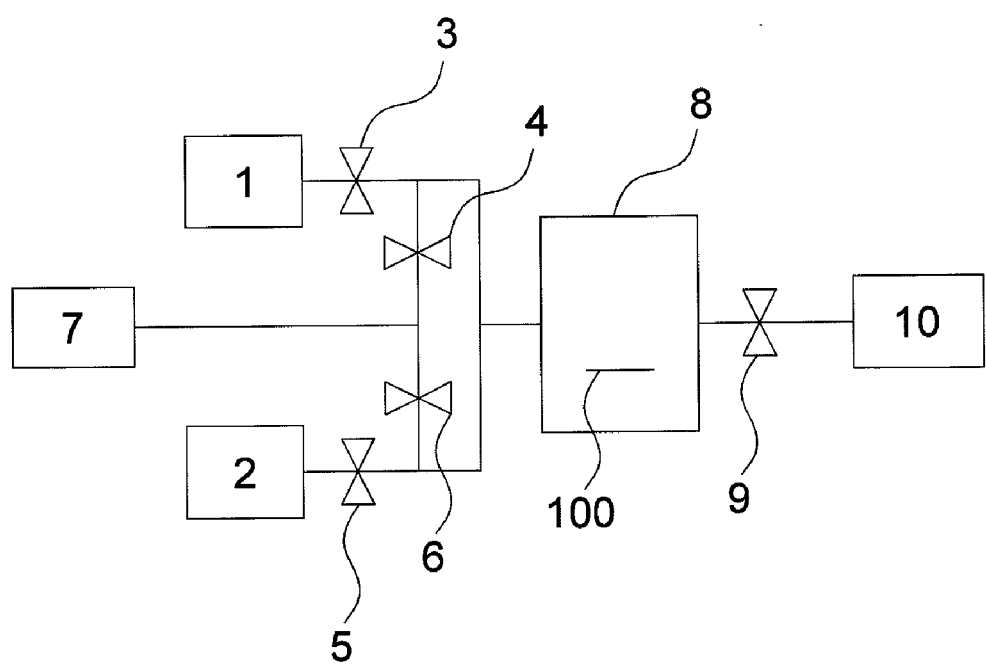
FIG. 1 is a schematic diagram of an atomic layer deposition (ALD) apparatus.

Referring to FIG. 1, FIG. 1 is a schematic diagram of an atomic layer deposition (ALD) apparatus. As shown in FIG. 1, the ALD apparatus comprises an inert gas supply 7, a chamber 8, a vacuum pump 10, a first deposition precursor supply 1, a second deposition precursor supply 2, a stock valve 9, four two-port solenoid valves 3, 4, 5, 6 and a manifold 11 having two inlets and one outlet. A first deposition precursor and a second deposition precursor is contained in the first deposition precursor supply 1 and the second deposition precursor supply 2 respectively. The stock valve 9 is connected between the chamber 8 and the vacuum pump 10 for the vacuum pump 10 to vacuum the chamber 8 or remove gaseous species (e.g. unreacted precursor, reaction products, etc.).

The two-port solenoid valve 3 is connected between the first deposition precursor supply 1 and one inlet of the manifold 11; the two-port solenoid valve 5 is connected between the second deposition precursor supply 2 and the other inlet of the manifold 11, while the outlet of the manifold 11 is connected to the chamber 8. The inert gas supply 7 is connected to the two inlets of the manifold 11 via two-port solenoid valves 4, 6 respectively, so that the inert gas may be mixed with the precursor and then an inert gas-precursor mix is introduced into the chamber 8 during processing for one application; or the inert gas may be introduced into the chamber 8 alone (i.e. without the precursor) to purge the chamber 8 during processing for another application. It should be understood that the inert gas is selected from a group consisting of nitrogen, xenon and argon.

It should be understood that any number of deposition precursor supplies may be used (e.g. 3, 4, 5, etc.). For example, each deposition precursor supply may be connected to respective ports in the chamber, or all precursor supplies may be connected to a manifold having multiple inlets and a single outlet of the manifold is connected to the chamber. Also, it should be understood that the amount of inert gas and/or deposition precursors introduced into the chamber can be controlled by controlling the operation of the valves therefor.

Figure 2:
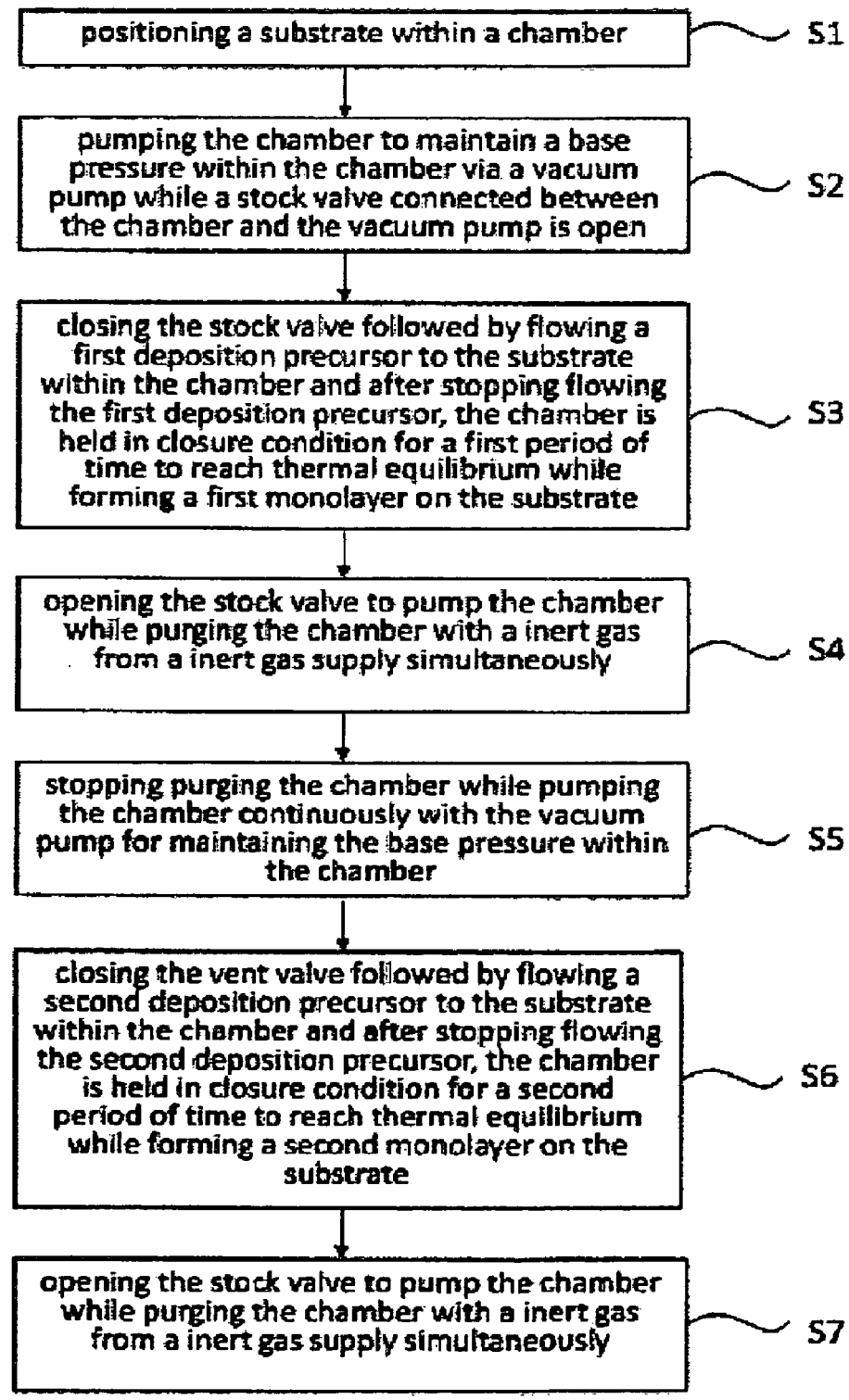
FIG. 2 is a flow chart illustrating steps of producing a thin film according to one embodiment of the present invention.

Referring to FIG. 1 and FIG. 2, FIG. 2 is a flow chart illustrating steps of producing a thin film according to one embodiment of the present invention. As shown in FIG. 2, a method according to the embodiment comprises (S1) positioning a substrate 100 within the chamber 8 of the ALD apparatus in FIG. 1; (S2) pumping the chamber 8 to maintain a base pressure within the chamber 8 via the vacuum pump 10 while the stock valve 9 connected between the chamber 8 and the vacuum pump 10 is open, wherein the base pressure is controlled to be in a range of $1 \times 10^{-10}$ torr to $1 \times 10^3$ torr; (S3) closing the stock valve 9 followed by flowing the first deposition precursor to the substrate 100 within the chamber 8 (i.e. opening the two-port solenoid valve 3), and after stopping flowing the first deposition precursor (i.e. closing the two-port solenoid valve 3), the chamber 8 is held in closure condition for a first period of time to reach thermal equilibrium while forming a first monolayer on the substrate 100; (S4) opening the stock valve 9 to pump the chamber 8 while purging the chamber 8 with an inert gas from the inert gas supply 7 simultaneously (i.e. opening the two-port solenoid valve 4 or 6); (S5) stopping purging the chamber 8 (i.e. closing the two-port solenoid valve 4 or 6) while pumping the chamber 8 continuously with the vacuum pump 10 for maintaining the base pressure within the chamber 8; (S6) closing the stock valve 9 followed by flowing a second deposition precursor to the substrate 100 within the chamber 8 (i.e. opening the two-port solenoid valve 5), and after stopping flowing the second deposition precursor (i.e. closing the two-port solenoid valve 5), the chamber 8 is held in closure condition for a second period of time to reach thermal equilibrium while forming a second monolayer on the substrate 100; and (S7) opening the stock valve 9 to pump the chamber 8 while purging the chamber with the inert gas from the inert gas supply 7 simultaneously (i.e. opening the two-port solenoid valve 4 or 6). Step S2 to step S7 are repeated until the desired film thickness is achieved, and it should be noted that two-port solenoid valves 3, 4, 5 and 6 are closed during step S2. Also, it should be noted that the first period of time and the second period of time are between 1 sec to 10000 sec depending on the species of deposition precursors and a time interval between the time that the stock valve 9 is closed and the time that the stock valve 9 is opened after the first monolayer or the second monolayer is formed on the substrate 100 during step S3 to step S4 is substantially between 0.0001 sec and 100000 sec. Besides, the pressure within the chamber 8 during thin film deposition is substantially between $1 \times 10^{-10}$ torr and $1 \times 10^3$ torr. The first deposition precursor is selected from a group consisting of group IIA metals and group IIB metals of the periodic table; and the second deposition precursor is selected from a group consisting of group VIA and group VIB of the periodic table; alternatively, the first deposition precursor is selected from a group consisting of group IIIA and group IIIB of the periodic table; and the second deposition precursor is selected from a group consisting of group, VA and group VB of the periodic table. In another ALD apparatus, a temperature controller (not shown) may be introduced to control the temperature of the chamber 8 during processing; therefore, another embodiment according to the present invention further comprises controlling the temperature in the chamber 8 from −20° C. to 1200° C. Another embodiment according to the present invention further comprises introducing a dopant flowing simultaneously with the first deposition precursor or the second deposition precursor on the substrate to produce a doped monolayer. The dopant comprises: Mg, Zn, Al, Ga, In, Si, N, P, and As.

The method according to the present invention can be but not limited to be used to realize deposition of ZnO thin film in the chamber 8 with diethylzinc (DEZn) and deionized water as the first deposition precursor and the second deposition precursor respectively. Growth of ZnO thin film on the substrate 100 in the chamber 8 can be maintained in a thermal equilibrium state and a constant pressure by keeping the first deposition precursor and the second deposition precursor inside the chamber 8 while two-port solenoid valves 3, 5 is closed during step S3 and step S6.

Figure 3:
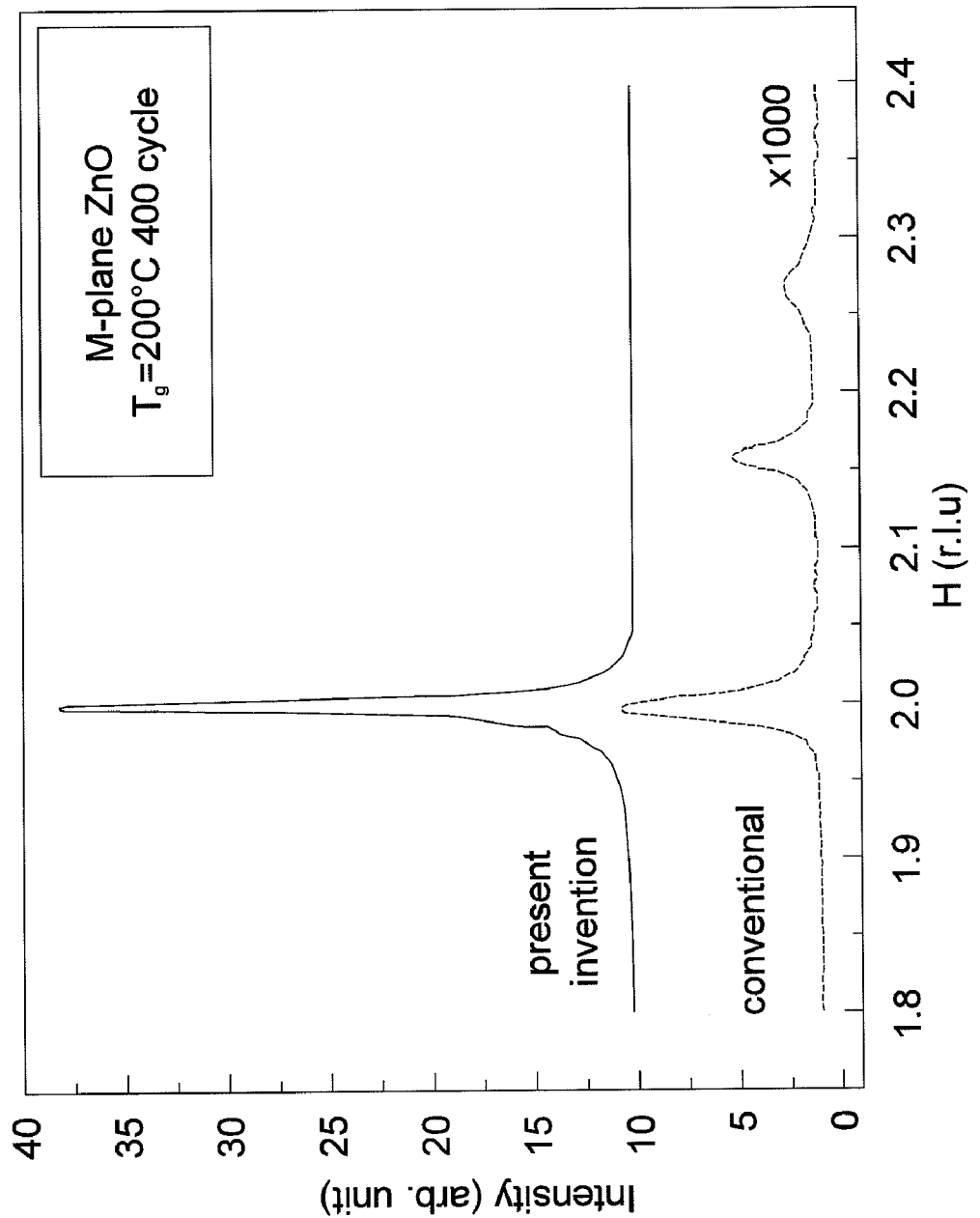
FIG. 3 is a chart illustrating high-resolution X-ray diffraction (XRD) measurements of the microstructure of a ZnO thin film on a substrate (e.g. a m-plane sapphire) produced by the method according to the present invention and a conventional ALD method.

FIG. 3 is a chart illustrating high-resolution X-ray diffraction (XRD) measurements of the microstructure of the ZnO thin film on a substrate (e.g. a m-plane sapphire) produced by the method according to the present invention and a conventional ALD method. It is shown that a diffraction intensity of the ZnO thin film using the method according to the present invention is 3000 times larger than that using the conventional ALD method. The result indicates that a covering film of high aspect ratio is formed.

Figure 4:
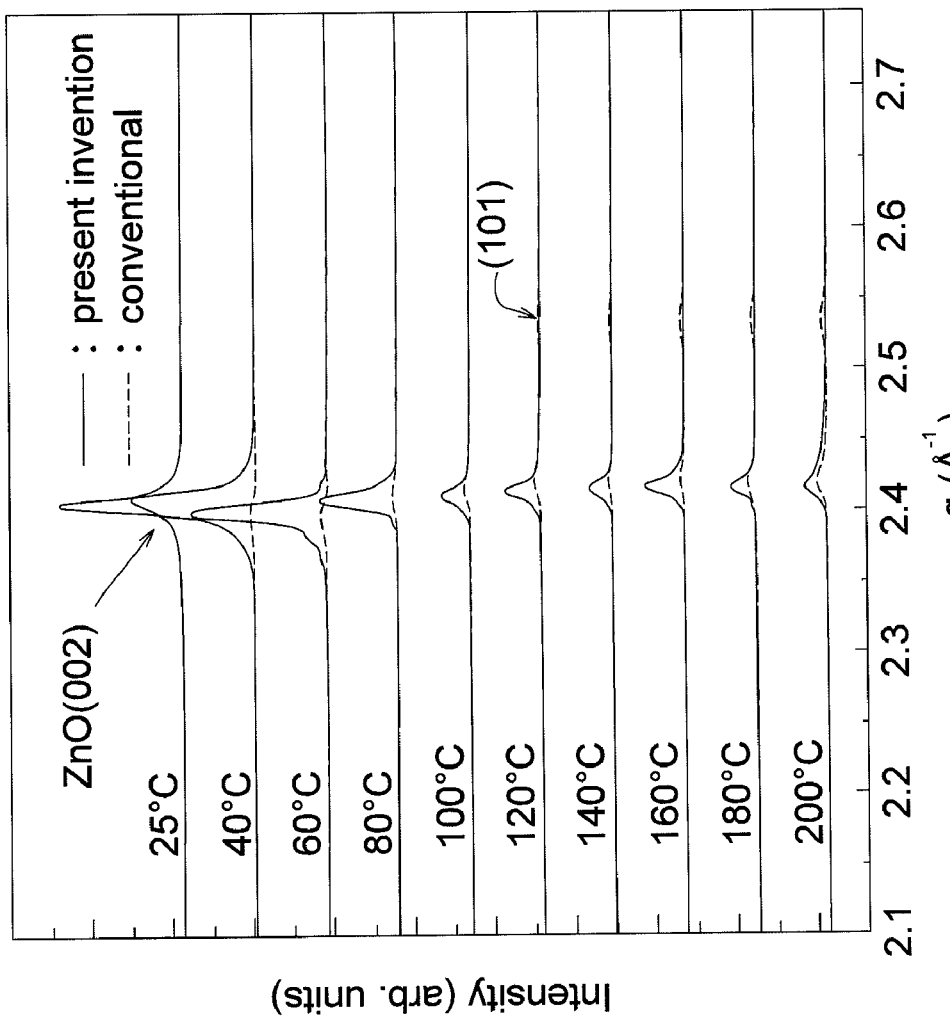
FIG. 4 is a chart illustrating high-resolution X-ray diffraction (XRD) measurements of a microstructure of a ZnO thin film on a substrate (e.g. a c-axis oriented $Al_2O_3$ substrate) produced by the method according to the present invention and a conventional ALD method at different growing temperature.

FIG. 4 is a chart illustrating high-resolution X-ray diffraction (XRD) measurements of the microstructure of the ZnO thin film on a substrate (e.g. a c-axis oriented $Al_2O_3$ substrate) produced by the method according to the present invention and a conventional ALD method at different growing temperature. A diffraction intensity of the ZnO thin film produced by the method according to the present invention is stronger than that of the ZnO thin film produced by the conventional ALD method at low growing temperature (e.g. 25° C. to 80° C.). Besides, a peak intensity is detected at axis (101) of the ZnO thin film produced by the conventional ALD method at the growing temperature above 120° C. indicating that the film becomes a polycrystalline structure. The ZnO thin film produced by the method according to the present invention has not become a polycrystalline structure until the growing temperature is above 180° C. indicating that the method according to the present invention has a wider growth window for a thin film.

Figure 5:
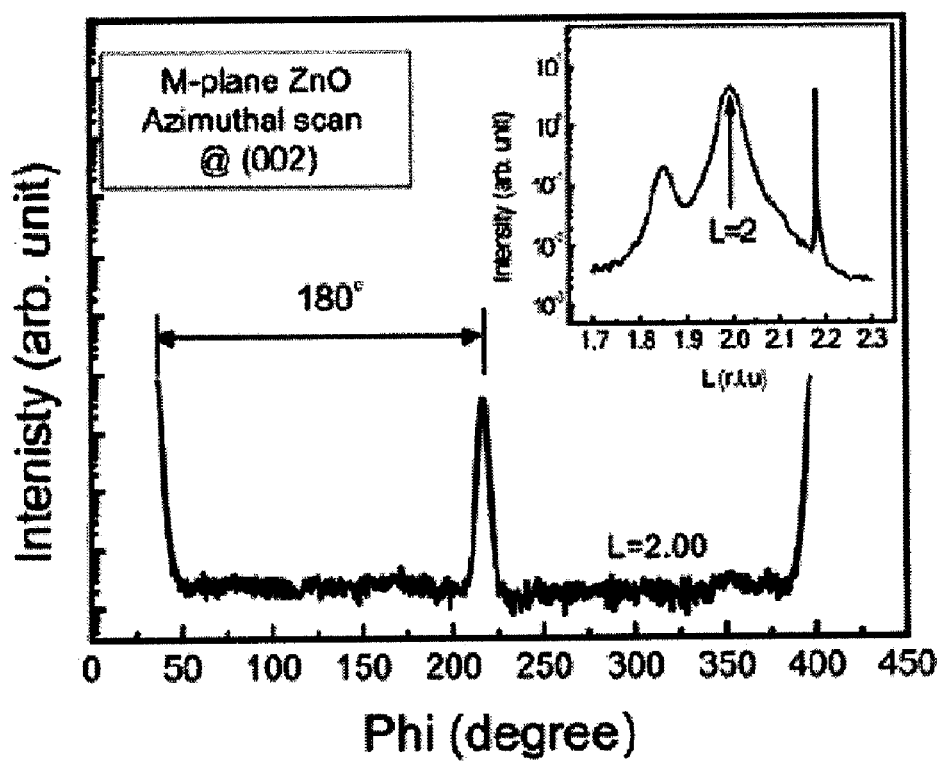
FIG. 5 illustrates an intensity distribution of the ZnO thin film produced by the method according to the present invention, (where the intensity distribution ranges from 0° to 360° bearing angle with respect to an axis (002) on the In-plane of the ZnO thin film)

FIG. 5 illustrates an intensity distribution of the ZnO thin film produced by the method according to the present invention. The intensity distribution ranges from 0° to 360° bearing angles with respect to an axis (002) on the In-plane of the ZnO thin film. Two axises symmetry and 180° bearing angle difference between axis (00-2) and axis (002) are found in FIG. 5, indicating that an epitaxially grown thin film is formed.

Therefore, the method according to the present invention maintains the growing temperature of ZnO thin films in a range of 25° C. to 160° C., effectively decreasing the growing temperature of the conventional ALD method, by about 120° C., thereby having lower background carrier concentration and reducing deposition precursor consumption more than 10 times comparing to the conventional ALD method. All results show that a low growing temperature improves the crystalline quality and is consistent with thermodynamically blocked self-compensation.

In summary, by introducing a first deposition precursor or a second deposition precursor into a chamber after a stock valve connected between the chamber and a vacuum pump is closed, the chamber is maintained in a thermal equilibrium state and a constant pressure as a result of keeping the first deposition precursor and the second deposition precursor inside the chamber; therefore, the consumption of deposition precursors are reduced and an thin film epitaxial growth on the substrate is achieved.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A method of thin film epitaxial growth using atomic layer deposition comprising:
    positioning a substrate within a chamber;
    pumping said chamber to maintain a base pressure within said chamber via a vacuum pump while a stock valve connected between said chamber and said vacuum pump is open;
    closing said stock valve followed by flowing a first deposition precursor to said substrate within said chamber, and after stopping flowing said first deposition precursor, said chamber is held in a closure condition for a first period of time to reach thermal equilibrium while forming a first monolayer on said substrate;
    opening said stock valve to pump said chamber while purging said chamber with an inert gas simultaneously;
    stopping purging said chamber while continuously pumping said chamber for maintaining said base pressure within said chamber;
    closing said stock valve followed by flowing a second deposition precursor to said substrate within said chamber, and after stopping flowing said second deposition precursor said chamber is held in a closure condition for a second period of time to form a second monolayer on said substrate to reach thermal equilibrium; and
    opening said stock valve to pump said chamber while purging said chamber with said inert gas simultaneously.

2. The method of thin film epitaxial growth using atomic layer deposition according to claim 1, wherein the pressure within said chamber during thin film deposition is substantially between $1\times10^{-10}$ torr and $1\times10^3$ torr.

3. The method of thin film epitaxial growth using atomic layer deposition according to claim 1, wherein said base pressure within said chamber is substantially between $1\times10^{-10}$ torr and $1\times10^3$ torr.

4. The method of thin film epitaxial growth using atomic layer deposition according to claim 1, further comprising controlling the temperature in said chamber from $-20°$ C. to $1200°$ C.

5. The method of thin film epitaxial growth using atomic layer deposition according to claim 1, wherein said first period of time and said second period of time are between 1 sec to 10000 sec.

6. The method of thin film epitaxial growth using atomic layer deposition according to claim 1, wherein a time interval between the time that said stock valve is closed and the time that said stock valve is opened after said first monolayer or said second monolayer is formed on said substrate is substantially between 0.0001 sec and 100000 sec.

7. The method of thin film epitaxial growth using atomic layer deposition according to claim 1, further comprising introducing a dopant flowing simultaneously with said first deposition precursor or said second deposition precursor on the substrate.

8. The method of thin film epitaxial growth using atomic layer deposition according to claim 7, wherein said dopant comprises: Mg, Zn, Al, Ga, In, Si, N, P, and As.

9. The method of thin film epitaxial growth using atomic layer deposition according to claim 1, wherein said first deposition precursor is selected from a group consisting of group IIA metals and group IIB metals of the periodic table; and said second deposition precursor is selected from a group consisting of group VIA and group VIB of the periodic table.

10. The method of thin film epitaxial growth using atomic layer deposition according to claim 1, wherein said first deposition precursor is selected from a group consisting of group IIIA and group IIIB of the periodic table; and said second deposition precursor is selected from a group consisting of group VA and group VB of the periodic table.

11. The method of thin film epitaxial growth using atomic layer deposition according to claim 1, wherein said inert gas is selected from a group consisting of nitrogen, xenon and argon.

* * * * *